United States Patent
Nishiuchi et al.

(10) Patent No.: US 7,270,714 B2
(45) Date of Patent: Sep. 18, 2007

(54) SURFACE TREATING APPARATUS

(75) Inventors: Takeshi Nishiuchi, Osaka (JP);
Yoshimi Tochishita, Hyogo (JP);
Fumiaki Kikui, Osaka (JP); Mitsuo Kizawa, Hyogo (JP)

(73) Assignee: Sumitomo Special Metals Co., Ltd., Osaka-shi (JP)

( * ) Notice: Subject to any disclaimer, the term of this patent is extended or adjusted under 35 U.S.C. 154(b) by 0 days.

(21) Appl. No.: 10/615,381

(22) Filed: Jul. 9, 2003

(65) Prior Publication Data
US 2004/0007184 A1    Jan. 15, 2004

Related U.S. Application Data

(62) Division of application No. 10/094,650, filed on Mar. 12, 2002, now Pat. No. 6,617,044, which is a division of application No. 09/568,580, filed on May 11, 2000, now Pat. No. 6,391,386.

(30) Foreign Application Priority Data

| May 14, 1999 | (JP) | ................................. 11-134998 |
| May 14, 1999 | (JP) | ................................. 11-134999 |
| Apr. 19, 2000 | (JP) | ............................. 2000-117771 |

(51) Int. Cl.
*C23C 14/24* (2006.01)
(52) U.S. Cl. .................................... 118/726
(58) Field of Classification Search ............... 118/726
See application file for complete search history.

(56) References Cited

U.S. PATENT DOCUMENTS 3,097,113 A * 7/1963 Welsh ......................... 118/726

(Continued)

FOREIGN PATENT DOCUMENTS

CN       62-149054       7/1987

(Continued)

OTHER PUBLICATIONS

Webster's Ninth New collegiate Dictionary, Meriam-Webster, 1986, p. 581.*

(Continued)

*Primary Examiner*—Richard Bueker
(74) *Attorney, Agent, or Firm*—Kratz, Quintos, & Hanson, LLP

(57) ABSTRACT

A surface treating process according to the present invention, a vapor deposited film is formed from an easily oxidizable vapor-depositing material on the surface of a work by evaporating the vapor-depositing material in a state in which the vapor deposition controlling gas has been supplied to at least zones near a melting/evaporating source and the work within a treating chamber. Thus, the vapor deposited film can be formed stably on the surface of a desired work without requirement of a long time for providing a high degree of vacuum and without use of a special apparatus. In addition, the use of the surface treating process ensures that a corrosion resistance can be provided to a rare earth metal-based permanent magnet extremely liable to be oxidized, without degradation of a high magnetic characteristic of the magnet. A surface treating apparatus according to the present invention includes a melting/evaporating source for melting and evaporating a wire-shaped vapor-depositing material containing a vapor deposition controlling gas, and a member for retaining a work on which the vapor-depositing material is deposited. The melting/evaporating source and the work retaining member are disposed in a treating chamber of the surface treating chamber. The apparatus further includes a vapor-depositing material supply means for supplying the wire-shaped vapor-depositing material containing the vapor deposition controlling gas to the melting-evaporating source.

3 Claims, 3 Drawing Sheets

U.S. PATENT DOCUMENTS

| | | | | |
|---|---|---|---|---|
| 3,750,623 A | * | 8/1973 | Carpenter et al. | 118/723 VE |
| 3,926,147 A | * | 12/1975 | Steube | 118/723 VE |
| 4,116,161 A | * | 9/1978 | Steube | 118/715 |
| 4,233,937 A | * | 11/1980 | Steube | 118/727 |
| 4,988,535 A | | 1/1991 | Arai et al. | 427/38 |
| 5,154,978 A | | 10/1992 | Nakayama et al. | 427/129 |
| 6,280,792 B1 | * | 8/2001 | Tochishita et al. | 427/248.1 |
| 6,444,328 B1 | | 9/2002 | Nishiuchi et al. | 428/450 |

FOREIGN PATENT DOCUMENTS

| | | | |
|---|---|---|---|
| CN | 1189685 A | | 8/1998 |
| EP | 992605 | * | 4/2000 |
| JP | 60-92466 | | 5/1985 |
| JP | 60-092466 | * | 5/1985 |
| JP | 60-243843 | * | 12/1985 |
| JP | 06-158285 | * | 6/1994 |
| JP | 6-158285 | | 6/1994 |

OTHER PUBLICATIONS

Chinese Office Action issued Nov. 24, 2006 with translation.

* cited by examiner

SURFACE TREATING APPARATUS

This application is a divisional of prior application Ser. No. 10/094,650 filed Mar. 12, 2002 now U.S. Pat. No. 6,617,044, which is a divisional of prior application Ser. No. 09/568,580, filed May 11, 2000, U.S. Pat. No. 6,391,386.

BACKGROUND OF THE INVENTION

1. Field of the Invention

The present invention-relates to a surface treating process for stably vapor-depositing an easily oxidizable vapor-depositing material such as aluminum and zinc onto a work such as a rare earth metal-based permanent magnet, a surface treating apparatus and a vapor-depositing material suitable for carrying out such process, and a rare earth metal-based permanent magnet produced by such process.

2. Description of the Related Art

For a rare earth metal-based permanent magnet having a nature that it is liable to be deteriorated by oxidation, for example, it is a conventional practice to form an aluminum film on the surface of the magnet by vapor deposition to prevent the deterioration of the magnet caused by oxidation. A surface treating apparatus, for example, as shown in FIG. 3, is employed for such a surface treating process.

FIG. 3 shows an apparatus for forming a vapor deposited film of aluminum on the surface of a magnet, more specifically, a rare earth metal-based permanent magnet. A single or a plurality of hearths (a vessel for melting a vapor-depositing material) 2, each of which is a melting/evaporating source for evaporating aluminum 10 as a vapor-depositing material, are disposed on a hearth support base 4 risen on a support table 3 in a lower portion of a treating chamber (a vacuum chamber) 1 connected to an evacuating system which is not shown. Two cage-shaped work retaining members 5 each formed of a net-shaped material are disposed side-by-side for rotation about rotary shafts 6 in an upper-portion of the treating chamber 1.

This apparatus is designed, so that rare earth metal-based permanent magnets 30 as works are placed into each of the work retaining members 5, and the aluminum 10 is evaporated from the hearth 2 heated to a predetermined temperature by a heating means (not shown), while rotating the work retaining members 5, thereby forming a vapor deposited film of aluminum on the surface of each of the rare earth metal-based permanent magnets 30 in the work retaining members 5.

However, such surface treating apparatus suffers from (1) a problem that when the vapor deposition process is carried out using such surface treating apparatus under a high partial pressure of oxygen in the treating chamber, the aluminum evaporated from the melting/evaporating source, before reaching the works, is oxidized by oxygen present within the chamber and as a result, an aluminum film having an excellent quality cannot be formed, and (2) a problem that an aluminum oxide film is formed on the surface of molten aluminum within the melting/evaporating source and for this reason, aluminum as the vapor-depositing material is sufficiently not evaporated. If an attempt is made to increase the degree of vacuum for the purpose of reducing the partial pressure of oxygen in order to solve the above problems, it is necessary to carry out an evacuation for a long time. Therefore, if the time taken for the overall processing is supposed to be, for example, 2.5 hours, one hour is required for providing a degree of vacuum equal to or lower than $10^{-4}$ Pa, resulting in a problem of a poor productivity.

SUMMARY OF THE INVENTION

Accordingly, it is an object of the present invention to provide a surface treating process for stably vapor-depositing an easily oxidizable vapor-depositing material such as aluminum onto a work such as a rare earth metal-based permanent magnet without requirement of a long time for providing a high degree of vacuum and without use of a special apparatus, and a surface treating apparatus suitable for carrying out such process and the like.

As a result of zealous studies made to solve the above problems, the present inventors have found that if the vapor-depositing material is evaporated in a state in which zones near the melting/evaporating source and the works within the treating chamber are in such a gas atmosphere that the vapor deposition is controlled by a gas, e.g., by hydrogen, the vapor deposition treatment can be conducted extremely stably without requirement of a long time for providing a high degree of vacuum and without use of a special apparatus.

The present invention has been accomplished based on the above knowledge in view, and to achieve the above object, according to a first aspect and feature of the present invention, there is provided a surface treating process for forming a vapor deposited film from an easily oxidizable vapor-depositing material on the surface of a work, comprising the step of evaporating the vapor-depositing material in a state in which a vapor deposition controlling gas has been supplied to at least zones near a material melting/evaporating source and the work within a treating chamber.

According to a second aspect and feature of the present invention, in addition to the first feature, the wire-shaped vapor-depositing material containing the vapor deposition controlling gas is evaporated, while being supplied to the melting/evaporating source, whereby the vapor deposition controlling gas is supplied from the vapor-depositing material According to a third aspect and feature of the present invention, in addition to the second feature, the vapor deposition controlling gas is hydrogen.

According to a fourth aspect and feature of the present invention, in addition to the third feature, the evaporation of the vapor-depositing material is carried out under a partial pressure of oxygen equal to or higher than $10^{-3}$ Pa.

According to a fifth aspect and feature of the present invention, in addition to the fourth feature, the molar ratio of hydrogen to oxygen in at least a space between the melting/evaporating source and the work within the treating chamber is in a range of 10 to 250.

According to a sixth aspect and feature of the present invention, in addition to the third feature, the vapor-depositing material is an aluminum wire having a content of hydrogen in a range of 0.5 ppm to 11 ppm.

According to a seventh aspect and feature of the present invention, in addition to the first feature, the vapor deposition controlling gas is supplied by introducing it from the outside of the treating chamber.

According to an eighth aspect and feature of the present invention, in addition to the seventh feature, the vapor deposition controlling gas is hydrogen.

According to a ninth aspect and feature of the present invention, in addition to the eighth feature, the evaporation of the vapor-depositing material is carried out under a partial pressure of oxygen equal to or higher than $10^{-3}$ Pa.

According to a tenth aspect and feature of the present invention, in addition to the ninth feature, the molar ratio of hydrogen to oxygen in at least a space between the melting/evaporating source and the work within the treating chamber is in a range of 10 to 250.

According to an eleventh aspect and feature of the present invention, in addition to the eighth feature, the vapor-depositing material is aluminum having a content of hydrogen equal to or smaller than 0.5 ppm.

According to a twelfth aspect and feature of the present invention, there is provided a surface treating apparatus comprising a treating chamber connected to a evacuating system, a melting/evaporating source for melting and evaporating a wire-shaped vapor-depositing material containing a vapor deposition controlling gas, a member for retaining a work on which the vapor-depositing material is deposited, the melting/evaporating source and the work retaining member being disposed in the treating chamber, and a vapor-depositing material supply means for supplying the wire-shaped vapor-depositing material containing the vapor deposition controlling gas to the melting/evaporating source.

According to a thirteenth aspect and feature of the present invention, in addition to the twelfth feature, the vapor-depositing material supply means comprises a feed reel for feeding the wire-shaped vapor-depositing material.

According to a fourteenth aspect and feature of the present invention, in addition to the twelfth feature, the vapor deposition controlling gas is hydrogen.

According to a fifteenth aspect and feature of the present invention, in addition to the thirteenth feature, the molar ratio of the vapor deposition controlling gas to oxygen in at least a space between the melting/evaporating source and the work within the treating chamber can be adjusted by the feed rate of the vapor-depositing material fed from the feed reel.

According to a sixteenth aspect and feature of the present invention, there is provided a vapor-depositing material which is a wire having a content of hydrogen in a range of 0.5 ppm to 11 ppm.

According to a seventeenth aspect and feature of the present invention, there is provided a work having a vapor deposited film formed thereon from at least one metal selected from the group consisting of aluminum, titanium, zinc, tin, lead and bismuth by a surface treating process according to the first feature.

According to an eighteenth aspect and feature of the present invention, in addition to the seventeenth feature, the vapor deposited film contains hydrogen.

According to a nineteenth aspect and feature of the present invention, in addition to the eighteenth feature, the content of hydrogen in the vapor deposited film is in a range of 1 ppm to 20 ppm.

According to a twentieth aspect and feature of the present invention, in addition to the seventeenth feature, the work is a rare earth metal-based permanent magnet.

According to the present invention, by evaporating the easily oxidizable vapor-depositing material in a state in which the vapor deposition controlling gas such as hydrogen has been supplied to at least the zones near the melting/evaporating source and the work within the treating chamber, the vapor deposited film can be formed stably from the vapor-depositing material on the surface of a desired work without requirement of a long time for providing a high degree of vacuum and without use of a special apparatus. If the surface treating process according to the present invention is employed, a corrosion resistance can be provided to a rare earth metal-based permanent magnet extremely liable to be oxidized, without degradation of a high magnetic characteristic of the magnet.

DETAILED DESCRIPTION OF THE PRESENT INVENTION

Figure 1:
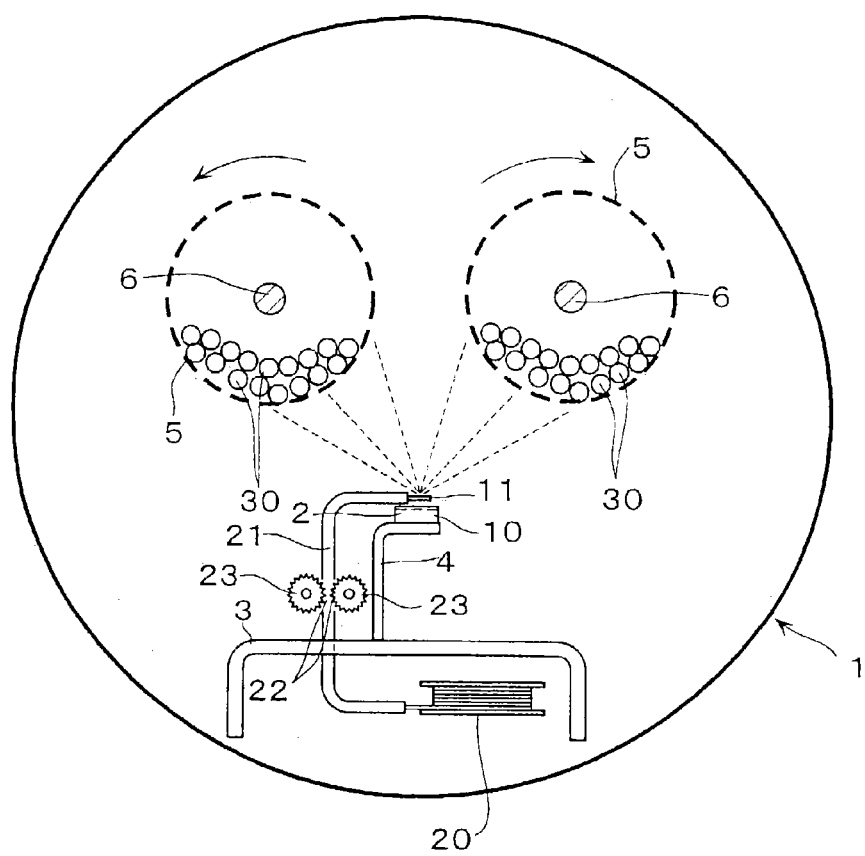
FIG. 1 is a diagrammatic front view of an embodiment of a surface treating apparatus for carrying out a surface treating process according to the present invention.

The work to be subjected to the surface treatment in the surface treating process according to the present invention is particularly not limited, and may be any article, if a vapor deposited film can be formed on the article by a vapor deposition treatment. However, the surface treating process according to the present invention is particularly suitable for the surface treatment of an article that needs to be continuously treated in bulk, e.g., a rare earth metal-based permanent magnet used as an electronic part material, because a long time cannot be requited for an evacuation carried out prior to the vapor deposition treatment.

The surface treating process according to the present invention is also applicable to the formation of a film by merely heating and evaporating a vapor-depositing material, for example, as in a vacuum evaporation process, and to the formation of a film by ionizing the evaporated vapor-depositing material, for example, as in an ion plating process.

The easily oxidizable vapor-depositing material used in the surface treating process according to the present invention is particularly not limited, and may be any material, if it can be used for forming a vapor deposited film. However, the surface treating process according to the present invention is suitable for the vapor deposition treatment using aluminum which is oxidized promptly even in the presence of a very small amount of oxygen. Examples of the material other than aluminum are titanium, zinc, tin, lead, bismuth and the like.

What the present invention contemplates is in that how the adverse affection provided by oxygen present at least the zones near the melting/evaporating source and the work is inhibited to ensure that the easily oxidizable vapor-depositing material evaporated from the melting/evaporating source reaches the work, and that a vapor deposited film having an excellent quality is formed on the surface of the work without formation of an oxide film on the surface of the molten vapor-depositing material within the melting/evaporating source. Therefore, to inhibit the adverse affection due to the presence of oxygen, the vapor deposition controlling gas must be supplied to the zones near the melting/evaporating source and the work, i.e., the space between the melting/evaporating source and the work. However, of course, it is not that the vapor deposition controlling gas must be supplied only to such areas, and the vapor deposition controlling gas may be supplied to the entire internal area of the chamber.

The term "vapor deposition controlling gas" used in the present invention means a gas having a function to improve the result of the vapor deposition by supplying the gas, as compared with a case where the gas is not supplied, and more specifically, means a reducing gas having a reactivity with oxygen. Examples of the reducing gas are carbon monoxide, hydrogen and the like, but from the viewpoint of the ease of handling, it is desirable to use hydrogen.

An example of a method for supplying the vapor deposition controlling gas to at least the zones near the melting/evaporating source and the work within the treating chamber is a method for supplying hydrogen from a wire-shaped vapor-depositing material containing hydrogen by evaporating the wire-shaped vapor-depositing material containing hydrogen, while supplying such vapor-depositing material to the melting/evaporating source. This method enables the vapor deposition controlling gas to be supplied efficiently to a desired area.

A surface treating apparatus for carrying out the above-described surface treating process will now be described with reference to the accompanying drawings. The following description is for the surface treatment of a rare earth metal-based permanent magnet as a work using a hydrogen-containing aluminum wire as an easily oxidizable vapor-depositing material.

Figure 2:
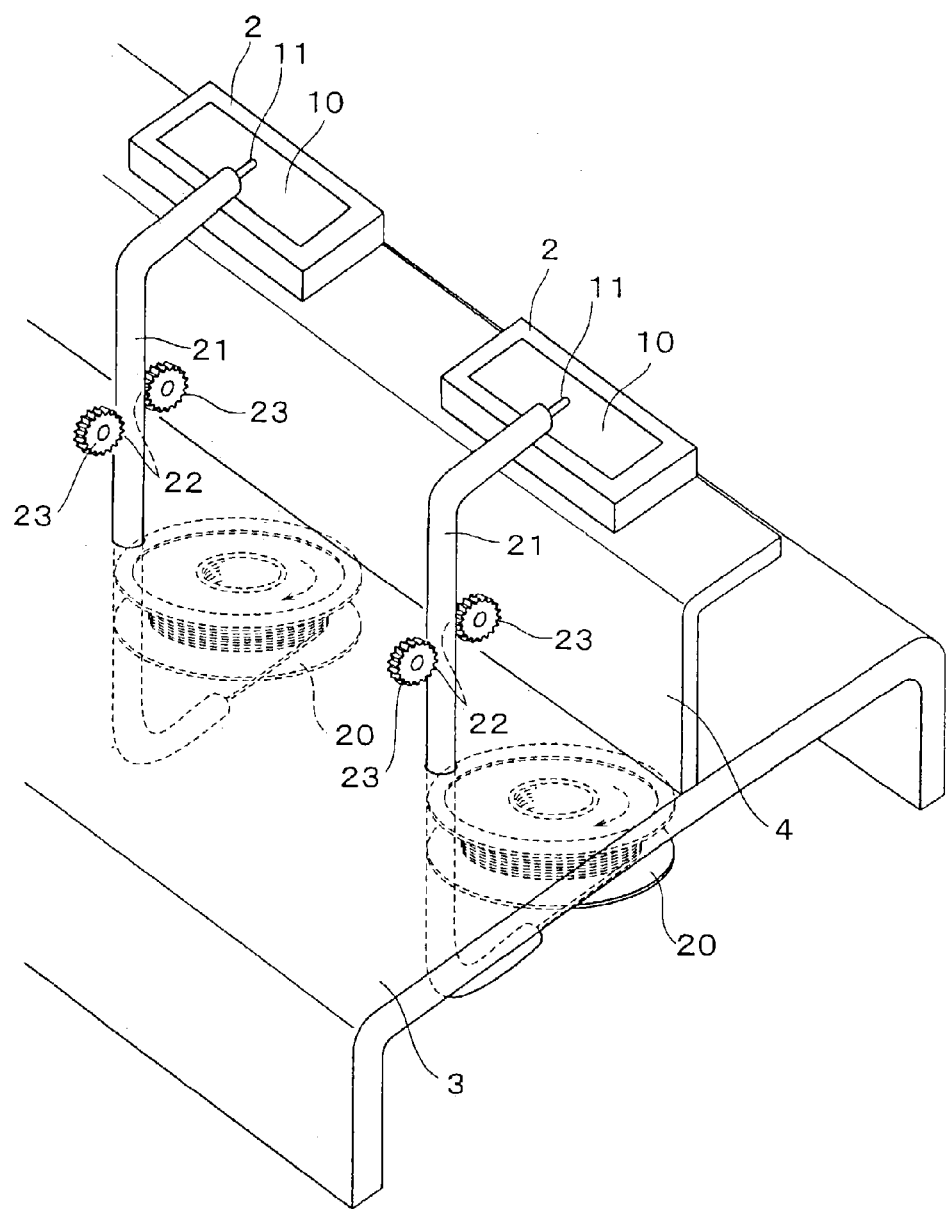
FIG. 2 is a diagrammatic enlarged perspective view of an essential portion of the surface treating apparatus.

FIGS. 1 and 2 show a preferred embodiment of the surface treating apparatus. A single or a plurality of hearths (a vessel for melting a vapor-depositing material) 2, each of which is a melting/evaporating source for evaporating aluminum 10 as a vapor-depositing material, are disposed on a hearth support base 4 risen on a support table 3 in a lower portion of a treating chamber (a vacuum chamber) 1 connected to an evacuating system which is not shown. Two cage-shaped work retaining members 5 each formed of a net-shaped material are disposed side-by-side for rotation about rotary shafts 6 in an upper portion of the treating chamber 1.

The apparatus is designed, so that rare earth metal-based permanent magnets 30 as works are placed into each of the work retaining members 5, and the aluminum 10 is evaporated from the hearth 2 heated to a predetermined temperature by a heating means (not shown), while rotating the work retaining members 5, thereby forming a vapor deposited film of aluminum on the surface of each of the rare earth metal-based permanent magnets 30 in the work retaining members 5.

The above-described arrangement is particularly not different from that of the conventional surface treating apparatus, but in the apparatus according to the present invention, an aluminum wire 11 containing a predetermined amount of hydrogen, which is a vapor-depositing material, is wound and retained around a feed reel 20 inside a lower portion of the support table 3. The direction of winding of the aluminum wire 11 around the feed reel 20 is horizontal for the purpose of preventing the twisting or deflection of the wire fed by the fact that the direction of winding of the aluminum wire 11 is perpendicular to a direction of feeding of the wire, i.e., a vertical direction. The proceeding end of the aluminum wire 11 is guided to above the hearth 2 by a thermal resistant protective tube 21 facing toward an inner surface of the hearth 2. A notched window 22 is provided in a portion of the protective tube 21, so that the aluminum wire 11 can be fed at a predetermined feed rate into the hearth 2 by a pair of feeding gears 23 mounted in correspondence to the notched window 22.

Thus, when the hearth 2 is heated to the predetermined temperature, and the aluminum wire 11 is continuously fed from the feed reel 20 toward the hearth 2, a predetermined amount of hydrogen can be released from the aluminum wire 11 upon melting of the aluminum wire 11 fed into the hearth 2, whereby aluminum which is the vapor-depositing material can be evaporated in a state in which a hydrogen atmosphere has been produced at least the zones near the hearth 2 as the melting/evaporating source and the rare earth metal-based permanent magnet 30 as the work, i.e., in the space between the hearth and the rare earth metal-based permanent magnet within the treating chamber 1.

In this case, a required amount of hydrogen for inhibiting the adverse affection due to the presence of oxygen can be supplied by regulating the amount of hydrogen contained in the aluminum wire and/or the feed rate of the aluminum wire fed, whereby the molar ratio of hydrogen to oxygen in at least the space between the melting/evaporating source and the work within the treating chamber 1 can be adjusted to a desired value.

For example, even under such a partial pressure of oxygen equal to or higher than $10^{-3}$ Pa that the amount of oxygen present in the treating chamber is too large, thereby making it difficult to conduct the vapor deposition treatment in the conventional process, the stable vapor deposition can be conducted to form an aluminum film having an excellent quality on the surface of the work, if aluminum is evaporated in a state in which hydrogen has been supplied, so that the above-described molar ratio is desirably in a range of 10 to 250, more desirably, in a range of 20 to 150. If the molar ratio is smaller than 10, the amount of hydrogen present is too small, and there is a possibility that an oxide film is formed on the surface of the molten vapor-depositing material within the melting/evaporating source to make the vapor deposition impossible. If the molar ratio exceeds 250, there is a possibility that hydrogen contained in the aluminum wire is boiled to produce a phenomenon of splashing of the molten vapor-depositing material; that the degree of vacuum is reduced due to a rise in total pressure in the treating chamber, whereby the vapor-depositing material is hard to evaporate; and that when the work is the rare earth metal-based permanent magnet, the magnet causes the hydrogen occlusion, resulting in the deterioration of the magnetic characteristic.

According to the reviews made by the present inventors, to ensure that at least the space between the melting/evaporating source and the work within the treating chamber is in the atmosphere having the desired molar ratio of hydrogen to oxygen, it is desirable that the aluminum wire having a diameter in a range of 1 mm to 2 mm and a hydrogen content in a range of 0.5 ppm to 11 ppm is used and fed at a feed rate in a range of 1 g/min to 10 g/min into the melting/evaporating source.

By carrying out the vapor deposition treatment under the above-described conditions, a vapor deposited film having an excellent quality and a hydrogen content in a range of 1 ppm to 20 ppm, particularly, in a range of 2 ppm to 15 ppm can be formed on the surface of the work.

The method for supplying the vapor deposition controlling gas at least the zones near the melting/evaporating source and the work within the treating chamber includes a method for supplying the vapor deposition controlling gas by introducing it from the outside of the treating chamber, in addition to the method for supplying the vapor deposition controlling gas generated from the wire-shaped vapor-depositing material containing the vapor deposition controlling gas by evaporating the wire-shaped vapor-depositing material containing the vapor deposition controlling gas, while supplying such material to the melting/evaporating source. The two methods may be employed along or in combination with each other.

When the method for supplying the vapor deposition controlling gas by introducing it from the outside of the treating chamber is employed, the vapor deposition controlling gas may be supplied only to at least the space between the melting/evaporating source and the work within the treating chamber, or may be supplied to the entire internal area in the treating chamber. Even when this method is employed alone, for example, even under such a partial pressure of oxygen equal to or higher than $10^{-3}$ Pa that the amount of oxygen present in the treating chamber is too large, thereby making it difficult to conduct the vapor deposition treatment in the conventional process, the stable vapor deposition can be conducted to form an aluminum film having an excellent quality on the surface of the work, if aluminum is evaporated in a state in which hydrogen has been supplied, so that the molar ratio of hydrogen to oxygen in at least the space between the melting/evaporating source and the work within the treating chamber is desirably in a range of 10 to 250, more desirably, in a range of 20 to 150.

When the method for supplying the vapor deposition controlling gas by introducing it from the outside of the treating chamber is employed alone, the amount of vapor deposition controlling gas supplied can be controlled easily by the amount of vapor deposition controlling gas introduced into the treating chamber, which is advantageous. Therefore, it is desirable in this case that the amount of vapor deposition controlling gas contained in the vapor-depositing material is extremely small. If a vapor-depositing material containing a vapor deposition controlling gas in an extremely small amount is used, even when the vapor-depositing material supplied to the melting/evaporating source is previously heated, and evaporated, it is little feared that the splashing is produced, and any of various heating-type vapor deposition treatments can be employed, which is advantageous. Suitable vapor-depositing materials are those having a hydrogen content equal to or smaller than 0.5 ppm.

The present invention particularly exhibits an effect in the vapor deposition treatment under the condition in which the amount of oxygen present in the treating chamber is too large, thereby making it difficult to conduct the vapor deposition treatment in the conventional process. In addition, the present invention also exhibits an effect even in the vapor deposition treatment under a high degree of vacuum containing a very small amount of oxygen. For example, the vapor deposition treatment of an electron beam heating process (EB vapor deposition treatment) is carried out usually under a high degree of vacuum lower than $10^{-3}$ Pa. Even under such a condition, when the vapor deposition is conducted over a long deposition time, the oxidation of the surface of the molten vapor-depositing material in the melting/evaporating source is advanced, whereby a stable vapor deposition is made difficult. With the surface treating process according to the present invention, such problem can be solved by supplying a predetermined amount of the vapor deposition controlling gas with the amount of oxygen present taken into account.

If the vapor deposition controlling gas is contained in the vapor-depositing material when the EB vapor deposition treatment is carried out, there is a possibility that a splashing is produced. Therefore, to carry out a stable EB vapor deposition treatment, it is desirable that the amount of vapor deposition controlling gas contained in the vapor-depositing material is small to the utmost, and it is desirable that the vapor deposition controlling gas is supplied from the outside of the treating chamber.

If a rare earth metal-based permanent magnet such as an R—Fe—B based permanent magnet is selected as a work, and a vapor deposited film of aluminum or the like is formed on the surface of the rare earth metal-based permanent magnet, the rare earth metal-based permanent magnet can be coated in an adhered manner with the film having an excellent quality. Therefore, it is possible to easily and reliably produce a rare earth metal-based permanent magnet having an excellent corrosion resistance. The rare earth metal-based permanent magnet produced by the process according to the present invention and having a film of, for example, aluminum, may be subjected to a known treatment such as a chromate treatment, a shot peening and the like for the purpose of further enhancing the corrosion resistance.

EXAMPLES

Particular examples will be described below. Examples A (Examples 1 to 6 and Comparative examples 1 and 2)

A known cast ingot was pulverized and then subjected sequentially to a pressing, a sintering, a heat treatment and a surface working, thereby producing a magnet test piece having a size of 23 mm×10 mm×6 mm and a composition of 17Nd-1Pr-75Fe-7B.

The magnet test piece was placed into a treating chamber (a vacuum chamber) in the surface treating apparatus (having an internal volume of 2.2 m$^3$) shown in FIGS. 1 and 2, and then, the vacuum chamber was evacuated, until the entire internal pressure in the vacuum chamber reached $1.0\times10^{-1}$ Pa. A partial pressure of oxygen in the vacuum chamber at this time was measured by a quadru-pole mass spectrometer (QIG-066 made by Anelva Co., Ltd.), and the number of molecules of oxygen present in the space between the melting/evaporating source and the work in the vacuum chamber was calculated with a volume of the space between the melting/evaporating source and the work in the vacuum chamber being defined to be 0.1 m$^3$ and with an average temperature of the melting/evaporating source and the work during the vapor deposition being defined to be 200° C. The partial pressure of oxygen and the number of molecules of oxygen present in the space are shown in Table 1.

The partial pressure of oxygen was determined by the quadru-pole mass spectrometer which was placed at a site where the total pressure was reduced to $1.0\times10^{-4}$ Pa by a differential evacuating system connected to an outer wall of the vacuum chamber, so that the measurement of the total pressure by the quadru-pole mass spectrometer during a surface sputtering (which will be described hereinafter) intended to clean the surface of the magnet test piece was equal to 1.0 Pa.

Then, an Ar gas was introduced into the vacuum chamber, so that the total pressure was equal to 1.0 Pa, and the surface of the magnet test piece was cleaned by the surface sputtering. Thereafter, the test piece was subjected to an ion plating by applying a voltage of 1.5 kV to heat, melt, evaporate and ionize the aluminum wire, whereby a test was carried out for forming an aluminum film having a thickness of 20 μm on the magnet test piece for 20 minutes.

The aluminum wires having different hydrogen contents as shown in the columns of Examples 1 to 6 and Comparative examples 1 and 2 in Table 1 were used, and it was examined whether the vapor deposition was possible or impossible (any of the wires has a diameter of 1.6 mm).

The aluminum wire was fed continuously at a feed rate of 3 g/min into each of the six hearths electrically heated in the vacuum chamber.

Shown in Table 1 are the amount of hydrogen produced per minute calculated from the content of hydrogen in the aluminum wire, and the value of the molar ratio of hydrogen (produced per minute) to oxygen in the space between the melting/evaporating source and the work, which was calculated from the above-described number of molecules of oxygen and the amount of hydrogen produced per minute. The partial pressure of hydrogen during the vapor deposition measured in the same manner, as was the partial pressure of oxygen, is also shown Table 1.

Also shown in Table 1 are the results of the test and the measured value of the amount of hydrogen in the aluminum film formed in each of Examples 1 to 6, which was measured by a glow discharge spectrometry (GDS) (using GDLS-5017 made by Shimadzu, Co.).

sure of oxygen in the vacuum chamber at this time was measured by the quadru-pole mass spectrometer placed directly in the outer wall of the vacuum chamber. The partial pressure of oxygen is shown in Table 2.

Then, an Ar gas was introduced into the vacuum chamber, so that the total pressure was $5.0 \times 10^{-4}$ Pa, and the surface of the magnet test piece was cleaned by the surface sputtering.

TABLE 1

|  | 1 | 2 | 3 | 4 | 5 | 6 | 7 | 8 |
|---|---|---|---|---|---|---|---|---|
| Com. Example 1 | 1.7E − 02 | 4.3E − 07 | 0.2 | 1.8E − 06 | 4.2 | 2.8E − 01 | X | — |
| Example 1 | 1.8E − 02 | 4.6E − 07 | 0.5 | 4.5E − 06 | 9.8 | 5.5E − 01 | ○ | 1.1 |
| Example 2 | 1.8E − 02 | 4.6E − 07 | 1.0 | 9.0E − 06 | 19.7 | 8.3E − 01 | ⊙ | 3.1 |
| Example 3 | 1.7E − 02 | 4.3E − 07 | 2.7 | 2.4E − 05 | 56.2 | 1.3E + 00 | ⊙ | 5.1 |
| Example 4 | 1.9E − 02 | 4.8E − 07 | 4.3 | 3.9E − 05 | 80.0 | 5.1E + 00 | ⊙ | 9.3 |
| Example 5 | 1.8E − 02 | 4.6E − 07 | 7.7 | 6.9E − 05 | 151.3 | 7.4E + 00 | ⊙ | 14.6 |
| Example 6 | 1.8E − 02 | 4.6E − 07 | 12.8 | 1.2E − 04 | 251.5 | 9.8E + 00 | ○ | 19.4 |
| Com. Example 2 | 1.8E − 02 | 4.6E − 07 | 19.6 | 1.8E − 04 | 385.0 | 1.5E + 01 | X | — |

1: Partial pressure of oxygen (Pa)
2: Number of molecules of oxygen between melting/evaporating source and work (mol)
3: Amount of hydrogen contained in aluminum wire (ppm)
4: Amount of hydrogen produced per unit time (mol/min)
5: Molar ratio of hydrogen to oxygen between melting/evaporating source and work {(mol/min)/mol}
6: Partial pressure of hydrogen (Pa)
7: Whether vapor deposition is possible or impossible (situation of molten aluminum)
8: Amount of hydrogen contained in film (ppm)
X in Comparative Example 1: surface oxidized:
○ in Example 1: surface partially oxidized
⊙ in Examples 2 to 5: good
○ in Example 6: slightly boiled
X in Comparative Example 2: boiled
Com. = Comparative As apparent from Table 1, in Examples 1 to 6, aluminum could be deposited on the magnet test piece with no problem. Particularly, in Examples 2 to 5, the good vapor deposition could be achieved. On the other hand, in Comparative Example 1, the amount of hydrogen produced relative to residual oxygen was not sufficient and hence, an oxide film was formed on the surface of the molten aluminum, thereby making the vapor deposition impossible. In Comparative Example 2, the amount of hydrogen produced was too large and hence, the boiling of the molten aluminum occurred, whereby the stable vapor deposition could not be achieved. Moreover, the deterioration of the magnetic characteristic due to the occlusion of hydrogen in the magnet test piece was observed.

Then, the magnet test piece having the aluminum film formed under the conditions in Example 2 was subjected to a corrosion resistance test for 500 hours under high-temperature and high-humidity conditions of a temperature of 80° C. and a relative humidity of 90%. As a result, (BH)max before the test was 243 kJ/m³; (BH)max after the test was 233kJ/m³; and the deterioration of the magnetic characteristic was equal to or lower than 5%. The rusting of the magnet test piece was not observed and it was found that the magnet had an excellent corrosion resistance. Examples B (Examples 7 to 9 and Comparative Examples 3 to 5)

A test was carried out for forming an aluminum film having a thickness of 3 μm for 1 hour using a magnet test piece produced in a manner similar to that in Examples A.

Figure 3:
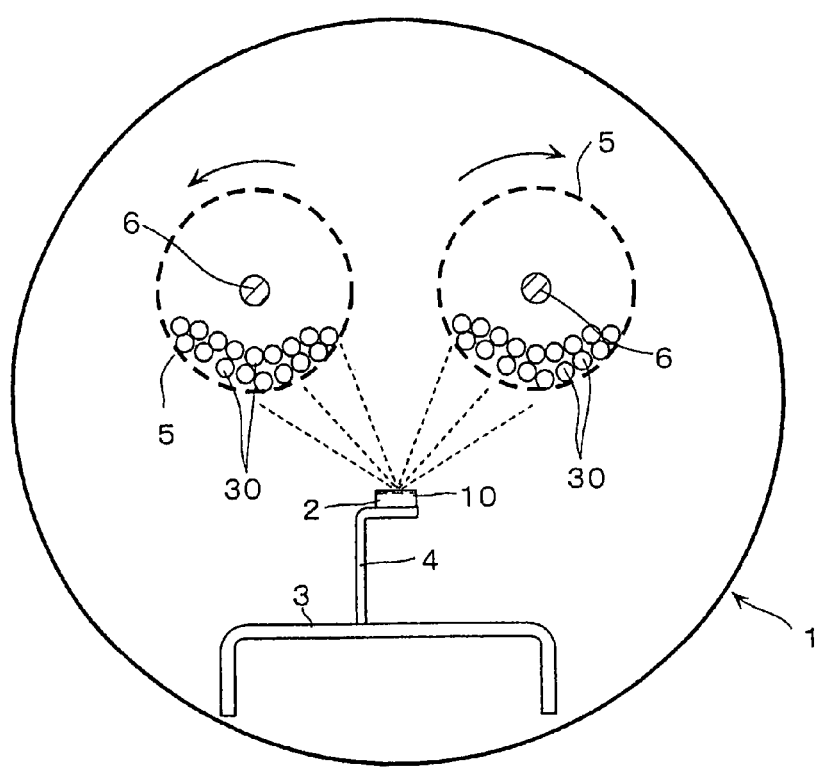
FIG. 3 is a diagrammatic front view of a surface treating apparatus used conventionally.

The magnet test piece was placed into a treating chamber (a vacuum chamber) in the surface treating apparatus (having an internal volume of 0.6 m³) shown in FIG. 3 and including the single hearth disposed therein. Then, the vacuum chamber was evacuated, until the total pressure in the vacuum chamber reached $3.0 \times 10^{-5}$ Pa. The partial pres- Then, the amount of Ar gas introduced was adjusted, so that the total pressure reached $3.0 \times 10^{-4}$ Pa.

In this case, a hydrogen gas was introduced along with the Ar gas, so that a partial pressure of hydrogen shown in each of Examples 7 to 9 and Comparative Examples 3 and 4 in Table 2 was achieved.

Thereafter, an aluminum ingot having a hydrogen content of 0.5 ppm was subjected to an ion plating by applying a voltage of 1 kV and applying an electron beam to the ingot to heat, melt, evaporated and ionize the ingot in an electron beam heating process.

A test was carried out as Comparative Example 5 using an aluminum ingot having a hydrogen content of 1.2 ppm under the same conditions as in Example 8.

Results are shown in Table 2.

TABLE 2

|  | 1 | 2 | 3 | 4 |
|---|---|---|---|---|
| Comparative Example 3 | 2.3E − 06 | 0 | 0.5 | X |
| Comparative Example 4 | 2.5E − 06 | 1.5E − 06 | 0.5 | X |
| Example 7 | 2.2E − 06 | 3.0E − 06 | 0.5 | ○ |
| Example 8 | 2.3E − 06 | 4.5E − 06 | 0.5 | ⊙ |
| Example 9 | 2.2E − 06 | 6.0E − 06 | 0.5 | ⊙ |
| Comparative Example 5 | 2.3E − 06 | 4.5E − 06 | 1.2 | X |

1: Partial pressure of oxygen (Pa)
2: Partial pressure of hydrogen (Pa) introduced from the outside
3: Amount of hydrogen contained in aluminum ingot (ppm)
4: Whether vapor deposition is possible or impossible (situation of molten aluminum)
X in Comparative Examples 3 and 4: surface oxidized after 30 minutes
○ in Example 7: surface partially oxidized after 60 minutes (vapor deposition was possible)
⊙ in Examples 8 and 9: good
X in Comparative Example 5: boiled As apparent from Table 2, in Examples 7 to 9, the stable vapor deposition for the long time could be achieved by supplying the hydrogen gas providing the partial pressure of $3.0 \times 10^{-6}$ Pa or more. On the other hand, in Comparative Examples 3 and 4, an aluminum oxide film was formed on the surface of the molten aluminum by the vapor deposition for the long time, whereby the stable vapor deposition could not be achieved. In Comparative Example 5, the amount of hydrogen contained in the aluminum ingot was too large and hence, the boiling of the molten aluminum occurred, whereby the stable vapor deposition could not be achieved.

What is claimed is:

1. A surface treating apparatus comprising:

a treating chamber connected to an evacuating system;

a melting/evaporating source for melting and evaporating a wire-shaped vapor-depositing material containing a vapor deposition controlling gas, disposed in the treating chamber;

a rotatable cage-shaped, work retaining member, disposed in the treating chamber, and spaced above the melting/evaporating source, for retaining a work on which the vapor depositing material is deposited;

a supply of wire-shaped vapor-depositing material containing a predetermined amount of the vapor deposition controlling gas wound about a feed reel;

a thermal resistant protective tube disposed between the feed reel and the melting/evaporating source; and the feed reel being mounted so as to rotate about a substantially vertical rotational axis, and disposed in the treating chamber below the melting/evaporating source;

such that, as the wire-shaped vapor-depositing material containing the vapor deposition controlling gas is supplied from the feed reel to the melting/evaporating source, the wire-shaped vapor-depositing material containing the vapor deposition controlling gas has a horizontally disposed lower portion, a vertically disposed intermediate portion and a horizontally disposed upper portion, and the wire-shaped vapor-depositing material containing the vapor deposition controlling gas is protected by the thermal resistant protective tube between the feed reel and the melting/evaporating source.

2. A surface treating apparatus according to claim 1, wherein said vapor deposition controlling gas is hydrogen.

3. A surface treating apparatus according to claim 1, wherein the molar ratio of said vapor deposition controlling gas to oxygen in at least a space between said melting/evaporating source and said work within said treating chamber can be adjusted by the feed rate of said vapor-depositing material fed from said feed reel.

* * * * *

UNITED STATES PATENT AND TRADEMARK OFFICE
CERTIFICATE OF CORRECTION

PATENT NO. : 7,270,714 B2
APPLICATION NO. : 10/615381
DATED : September 18, 2007
INVENTOR(S) : Nishiuchi et al.

It is certified that error appears in the above-identified patent and that said Letters Patent is hereby corrected as shown below:

On the Title Page:

"(73) Assignee:    Sumitomo Special Metals Co., Ltd.,
                   Osaka-shi, Japan"

should read:

-- (73) Assignee:  Neomax Co., Ltd.
                   Osaka-shi, Japan --

Signed and Sealed this

Seventh Day of October, 2008

JON W. DUDAS
*Director of the United States Patent and Trademark Office*